US009289059B2

(12) United States Patent
Lineal et al.

(10) Patent No.: US 9,289,059 B2
(45) Date of Patent: *Mar. 22, 2016

(54) SHIELDED HEAT-DISSIPATING LAP CUSHION

(71) Applicants: Kara Lineal, Northbrook, IL (US); Joe Born, Lincolnwood, IL (US)

(72) Inventors: Kara Lineal, Northbrook, IL (US); Joe Born, Lincolnwood, IL (US)

(73) Assignee: Digital Innovations LLC, Arlington Heights, IL (US)

( * ) Notice: Subject to any disclaimer, the term of this patent is extended or adjusted under 35 U.S.C. 154(b) by 273 days.

This patent is subject to a terminal disclaimer.

(21) Appl. No.: 13/945,355

(22) Filed: Jul. 18, 2013

(65) Prior Publication Data

US 2014/0026789 A1  Jan. 30, 2014

Related U.S. Application Data

(63) Continuation of application No. 12/977,024, filed on Dec. 22, 2010, now Pat. No. 8,493,732.

(51) Int. Cl.
| | |
|---|---|
| H05K 7/20 | (2006.01) |
| A47B 23/00 | (2006.01) |
| A47B 23/04 | (2006.01) |
| G06F 1/16 | (2006.01) |
| G06F 1/20 | (2006.01) |

(52) U.S. Cl.
CPC .............. *A47B 23/00* (2013.01); *A47B 23/04* (2013.01); *G06F 1/1632* (2013.01); *G06F 1/203* (2013.01); *H05K 7/20172* (2013.01)

(58) Field of Classification Search
CPC ...... A47B 23/00; A47B 23/04; G06F 1/1632; G06F 1/203; H05K 7/20172
USPC ......................... 361/679.46–679.54, 688–723
See application file for complete search history.

(56) References Cited

U.S. PATENT DOCUMENTS

| | | | |
|---|---|---|---|
| 5,622,262 A | 4/1997 | Sadow | 206/522 |
| 5,634,351 A | 6/1997 | Larson et al. | |
| 6,081,425 A | 6/2000 | Cheng | |
| 6,122,167 A | 9/2000 | Smith et al. | |
| 6,324,055 B1 | 11/2001 | Kawabe | |
| 6,487,073 B2 | 11/2002 | McCullough et al. | |
| 6,574,102 B2 | 6/2003 | Usui et al. | |
| 6,768,654 B2 | 7/2004 | Arnold et al. | |
| D522,002 S | 5/2006 | Cheng | D14/439 |
| 7,322,063 B2 | 1/2008 | Esimai | 5/652.1 |
| 7,324,340 B2 | 1/2008 | Xiong | |
| 7,336,489 B1 | 2/2008 | Chen et al. | 361/700 |
| 7,342,783 B2 | 3/2008 | Park | |
| 7,453,694 B2 | 11/2008 | Lee | 361/679.48 |
| 7,522,411 B2 | 4/2009 | Haglund | |
| 7,772,504 B1 * | 8/2010 | Tashjian | G06F 1/1628 174/380 |
| 7,857,276 B2 * | 12/2010 | Chen | A47B 23/002 165/76 |
| 7,986,527 B2 | 7/2011 | Sween et al. | 361/695 |
| 8,014,145 B2 | 9/2011 | Ho | 361/679.48 |
| 8,075,073 B2 * | 12/2011 | Huang | G06F 1/1632 312/223.1 |

(Continued)

*Primary Examiner* — Anthony Haughton
*Assistant Examiner* — Yahya Ahmad
(74) *Attorney, Agent, or Firm* — Clifford H. Kraft

(57) ABSTRACT

A lap cushion, for supporting an electronic device on a users lap, provides thermal insulation and cooling airflow between the electronic device and the user. The cushion further includes a shield positioned between the top surface and the electronic device where the shield is electrically-conductive and electrically-grounded so as to provide radiation absorption of RF electromagnetic radiation emanating from the electronic device.

16 Claims, 3 Drawing Sheets

(56) References Cited

U.S. PATENT DOCUMENTS

| | | | |
|---|---|---|---|
| 8,089,753 B2 | 1/2012 | Dotson | 361/679.48 |
| 8,493,732 B2 * | 7/2013 | Lineal | A47B 23/04 361/679.48 |
| 2005/0259385 A1 * | 11/2005 | Solomon | G06F 1/182 361/679.02 |
| 2009/0068910 A1 * | 3/2009 | Fredrick | B32B 37/0076 442/314 |
| 2009/0268403 A1 | 10/2009 | Chen et al. | |
| 2010/0073870 A1 * | 3/2010 | Diez Munoz | G06F 1/1616 361/679.55 |
| 2010/0134976 A1 | 6/2010 | Kuo | 361/695 |
| 2011/0038121 A1 * | 2/2011 | Tabasso | G06F 1/203 361/679.51 |
| 2011/0062045 A1 | 3/2011 | Kim | 206/522 |
| 2011/0248139 A1 | 10/2011 | Filkow | 248/346.03 |
| 2011/0309222 A1 * | 12/2011 | Hynell | G06F 1/203 248/346.02 |
| 2013/0235520 A1 * | 9/2013 | Huang | G60F 1/1632 361/679.48 |
| 2014/0009004 A1 * | 1/2014 | Schroeder | H05K 9/0043 307/326 |

* cited by examiner

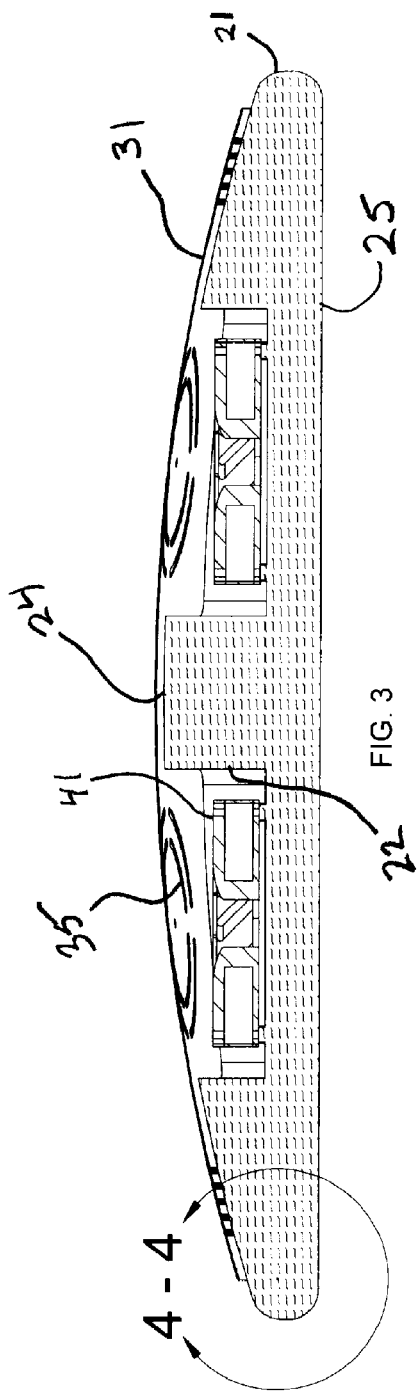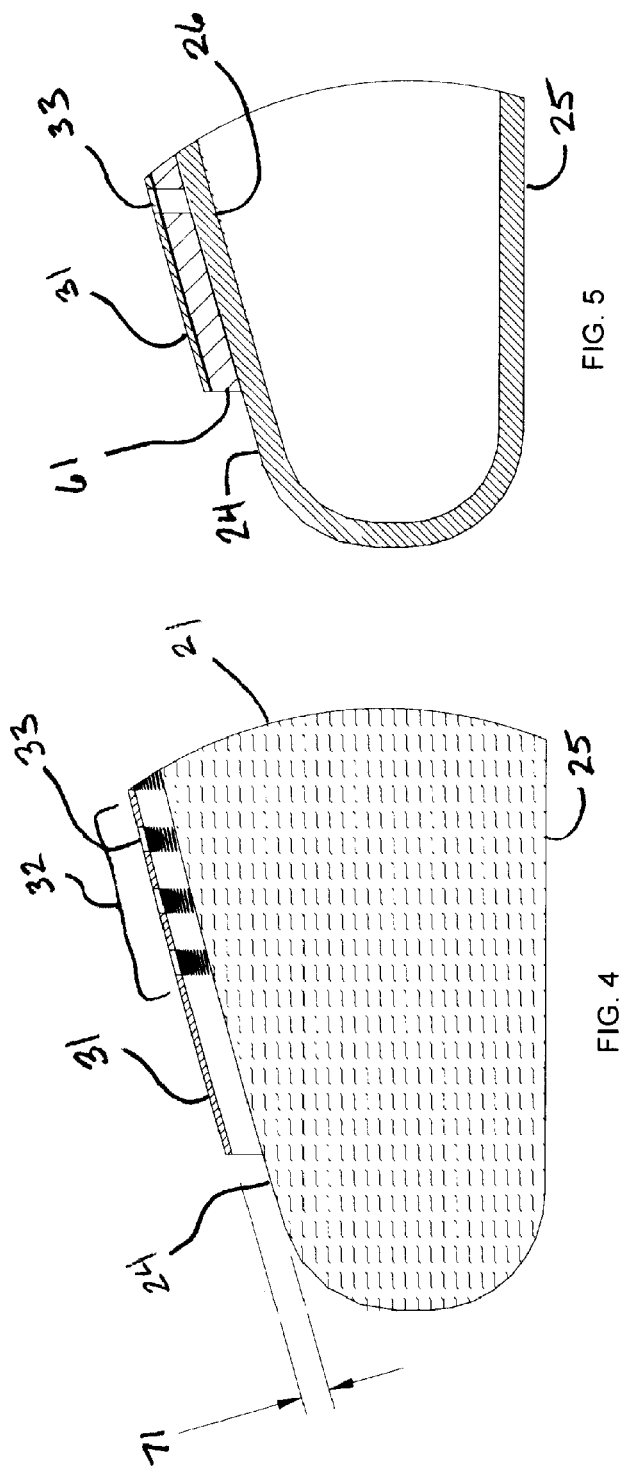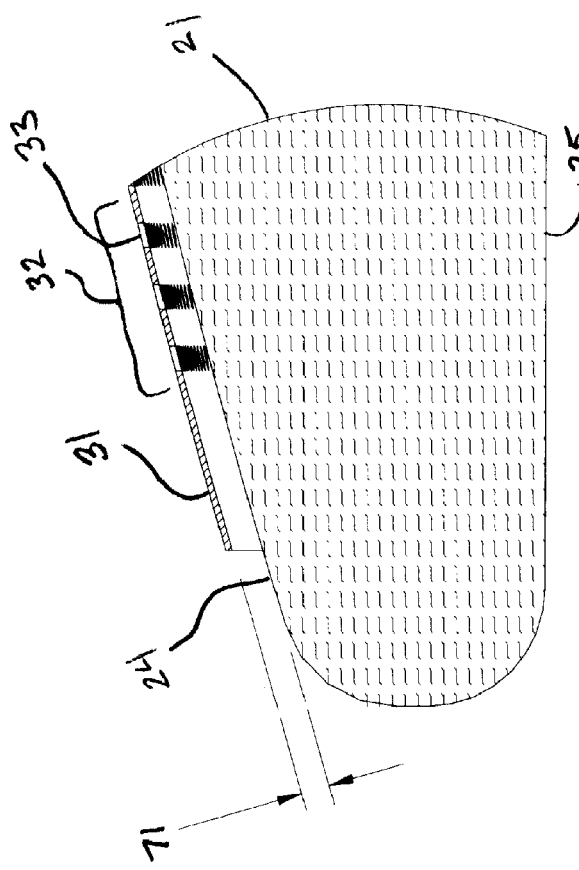

SHIELDED HEAT-DISSIPATING LAP CUSHION

This application claims priority to Ser. No. 12/977,024 filed Dec. 2, 2010. Application Ser. No. 12/977,024 is hereby incorporated by reference in its entirety.

FIELD OF THE INVENTION

The present invention relates generally to lap cushions for electronic devices, and more particularly, to lap cushions that facilitate dissipating heat generated by the electronic device and shielding a user from electromagnetic radiation emitted by the electronic device.

BACKGROUND OF THE INVENTION

Portable electronic devices, such as laptop computers, notebook computers, electronic notepads, and the like, have been popular consumer items for several years. As such devices get smaller and more powerful, users have found them useful as mobile devices. It is not unusual for the user to carry the electronic device on planes and on ground transportation, for use while in transit as well as to provide access to familiar programs and data at offsite venues. The portable computer, especially, has become a common and necessary accessory to many business persons and users traveling for pleasure. Consequently, user comfort and safety while using the devices is becoming more important.

Electronic devices generate heat, due in part to the high density of electronic circuitry found in today's devices. Even with internal fans and venting, a laptop computer, for example, can reach temperatures that are uncomfortable to touch, even at the outer case. In addition, electronic devices can emit electromagnetic radiation. Many electronic devices are shielded internally to protect close-packed components from interference, and some devices are further shielded to prevent emissions from leaking out of their enclosures. However, such radiation shielding is not foolproof. Furthermore, modern devices are increasingly equipped for wireless communications, which require the devices transmit and receive broadcast signals within specific wavelength ranges.

As a result consumer awareness of potential health hazards related to radiation from wireless communications, along with a desire for physical comfort, there is a continuing need to develop a lap cushion that enhances user comfort and safety while using a portable electronic device.

SUMMARY OF THE INVENTION

According to one embodiment, a lap cushion for supporting an electronic device having wireless communication capabilities comprises a resilient pad having a bottom surface and a top surface. The pad has a pad thermal conductivity coefficient. The lap cushion further comprises an electrically-grounded, electrically-conductive shield that may extend across the majority of the top surface.

According to another embodiment, a lap cushion comprises a resilient pad having a bottom surface and an top surface and having a pad thermal conductivity coefficient, an electrically-grounded, electrically conductive shield that may extend across the majority of the top surface, and at least one electric fan mounted to the pad and propelling air through the shield and away from the pad.

According to yet another embodiment, a lap cushion having targeted RF shielding protecting a user from RF electromagnetic radiation emitted by an electronic device with wireless communication capabilities comprises a resilient pad having a bottom surface and a top surface, the bottom surface being configured to rest on a lap, and the pad having a pad thermal conductivity coefficient. The lap cushion further includes an electrically-grounded, electrically-conductive shield extending across a majority of the top surface, and the shield has one or more perforated regions extending at least around a shield periphery, the one or more perforated regions having a plurality of through-holes distributed across the perforated region to produce an open area between 25 and 65 percent, each through-hole being less than 10 mm across the largest dimension. The lap cushion still further includes a medial layer separating the shield and the cushion, the layer having a layer thermal conductivity coefficient, and the layer thermal conductivity coefficient being bottom than the pad thermal conductivity coefficient. The lap cushion also has at least one electric fan mounted within a pad cavity beneath the shield with the fan propelling air through the shield away from the pad.

BRIEF DESCRIPTION OF THE DRAWINGS

FIG. 3 is a side section view of the embodiment of FIG. 2.
FIG. 4 is a detail view from within line 4-4 in FIG. 3.
FIG. 5 shows an embodiment where the pad comprises a substantially rigid hollow shell.

DETAILED DESCRIPTION

Figure 1:
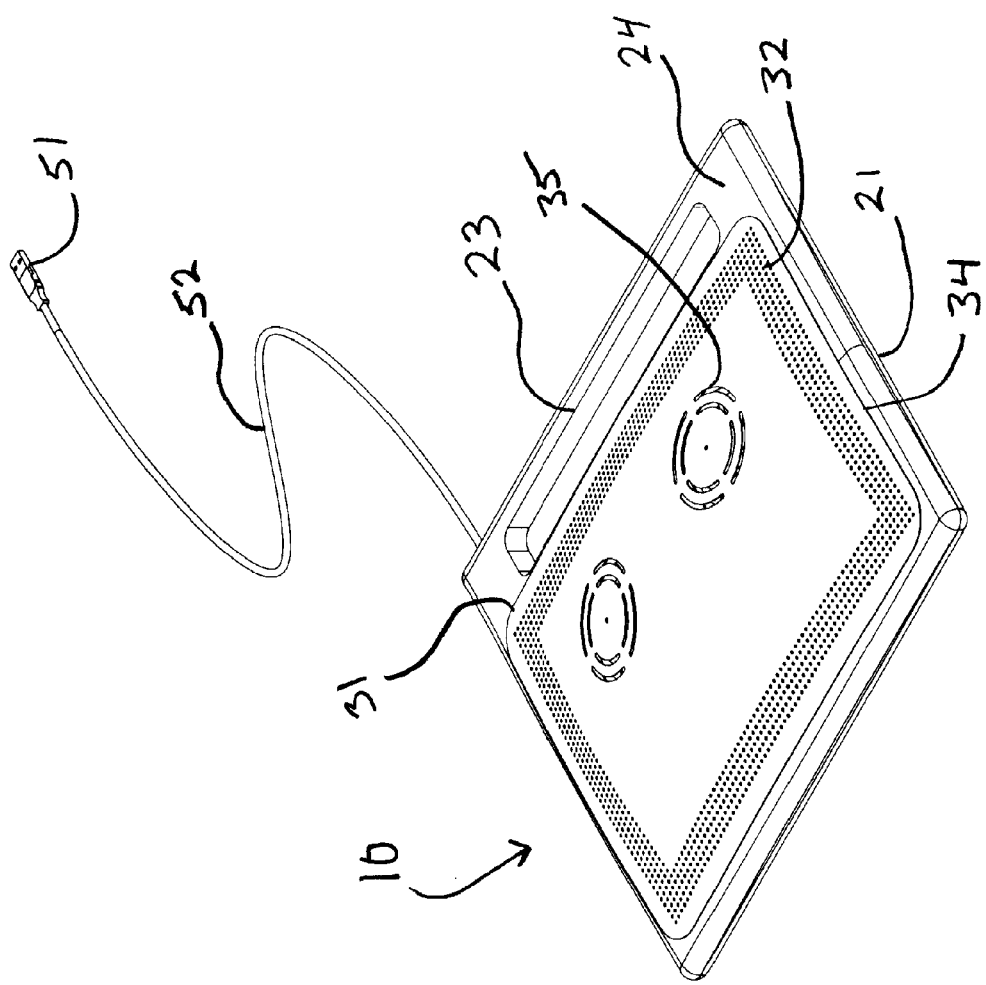
FIG. 1 is a perspective view of an embodiment of the invention.

While this invention is susceptible of embodiment in many different forms, there is shown in the drawings and will herein be described in detail preferred embodiments of the invention with the understanding that the present disclosure is to be considered as an exemplification of the principles of the invention and is not intended to limit the broad aspect of the invention to the embodiments illustrated.

In an embodiment of the invention shown in FIG. 1, a lap cushion 10 is disclosed for supporting an electronic device, such as a laptop computer, on a user's lap. The electronic device can be any of various electronic devices, including but not limited to a laptop computer, a notebook computer, a wireless personal organizer, an electronic book device, and any other device that a user might rest on their lap while in use. Additionally, the electronic device may have wireless broadcasting capabilities, utilizing such technologies as WiFi, Bluetooth, Wii, and other wireless communication systems operating via the RF spectrum. For convenience and brevity, "laptop" will be used here and throughout to refer to the various abovementioned devices as well as combinations and variations thereof.

The lap cushion 10 comprises a resilient pad 21 having a top surface 24 and a bottom surface 25. In some embodiments, the pad 21 may be sized to slightly exceed the general planar dimension of an average laptop. In some embodiments, the pad will be sufficiently large to cover a user's lap.

The pad may be configured to rest on the users lap and to remain substantially centered on the lap. For example, the pad bottom surface can comprise a gentle convex curvature so that the pad is biased to a centered position between a users thighs. Similarly, the pad bottom surface can comprise two, side-by-side, concavities configured to conform to the user's thighs. Alternatively, the bottom surface may be planar and may be presented in various configurations and combinations.

In the same vein, the top surface can be configured in various ways to provide generalized support for a wide variety of electronic devices, and can be configured to specifically address features of a specific laptop. In one embodiment, the top surface 24 may comprise a gentle convex curvature; in other embodiments, the top surface can be slightly concave and can be substantially planar.

The pad can provide insulating properties to protect the user from heat generated by the laptop. For example, the pad can have low thermal conductivity so that head emanating from the laptop is collected at the top surface and dissipated into the environment without traveling through the pad to the bottom surface. Alternatively, the pad can combine high thermal conductivity with enhanced dissipative properties so that heat quickly flows into the pad and is dispersed from the pad before reaching the bottom surface. Other modes of protection that fall within the inventive principles of the lap cushion can be envisioned by PHOSITA.

In one embodiment, such as the pad shown in FIG. 5, the pad may comprise a substantially rigid, hollow shell 26. In this embodiment, the air present within the shell can provide insulation properties to protect the user.

The pad 21 can comprise resilient material to facilitate comfortably supporting a laptop on the users lap. The pad may comprise synthetic material, including but not limited to closed and open-cell foam, flexible plastic gel material, shock-absorbing material, and various other materials and combinations.

In one embodiment, the pad comprises 3-dimensional, knitted, "spacer" fabric. 3-dimensional spacer fabric is produced via a special knitting technique and can comprise synthetics like polyester. The 3-dimensional structure provides support and cushioning. 3-dimensional spacer fabric can further comprise low density and similarly high porosity which can make spacer fabric an especially good material for applications where airflow through material is beneficial.

The pad may further include anti-microbial agents infused or applied to the pad material. In some embodiments, the pad can benefit from stain resistant material and material treatment.

The pad can comprise features that simplify and augment its usage as a support for an electronic device. In one embodiment, the pad 21 comprises an integral cord storage cavity 23 so that a user can store the various connecting cords as well as a power transformer. Similarly, the pad can comprise a receptacle for holding earphones or earbuds, memory sticks, and various adapters and components commonly used with electronic devices.

The lap cushion 10 further comprises an, electrically-conductive shield 31 extending across the majority of the pad top surface 24. The shield 31 can be metal, plastic with electrically-conductive coating, and can be various other materials and combinations that are electrically-conductive.

The shield 31 may be electrically-grounded so that the shields electric potential is at or near ground potential. The electrically-conductive, electrically-grounded shield 31 can absorb electromagnetic radiation emitted by the laptop before the radiation reaches the user. Even RF radiation frequencies straying towards the user can be absorbed by the shield 31, providing the user with a level of safety and security heretofore absent when utilizing portable electronic devices.

The shield may be grounded via a wired connection to an electrical outlet. In one embodiment, the shield comprises a wire connection to a ground pin of a grounded AC connector that can be plugged into a wall socket. In such a way, the potential energy of the shield is maintained at ground potential. The neutral and hot prongs of the AC connecter may be dummy prongs (i.e., unconnected) and, in some embodiments, can be utilized to power additional cushion components and peripheral components.

Alternatively, the shield 31 may be grounded via the electronic device itself. One way to ground the shield 31 to the electronic device can be to connect the shield 31 to the laptop via a cord 52 and a USB connector 51 plugged into a USB port on the laptop. A typical USB connection is grounded via the laptop, and so the shield 31 can be maintained at the ground potential of the laptop via the USB connection.

In some embodiments, the shield may be grounded to a battery negative terminal. The battery may be mounted to the lap cushion 10, for example, a battery utilized to power a peripheral device on the lap cushion 10. Alternatively, the battery providing grounding may be utilized to power the laptop in lieu of AC or utility power. The battery may be integral to the laptop or other electronic device.

The shield 31 may comprise one or more perforated regions, such as the perforated region 32, each region including a plurality of through-holes 33 distributed across the shield 31. Perforations can reduce weight and can increase air-flow through the shield 31, which can facilitate thermal conductivity. Additionally, perforation size and distribution across the shield 31 can be configured to provide targeted radiation absorption in certain ranges of radiation wavelengths, allowing shield 31 weight to be reduced while still providing ample protection to the user. Through-holes 33 in the perforated region 32 may be round, square, triangular, diamond-shaped, and various geometric and organic shapes and combinations of shapes.

The shield 31 may provide ample protection when the perforated region 32 comprises through-holes 33 no larger than 10 mm across their largest dimension and comprising open space in the perforated region 32 in the range of 25 to 65 percent. Further, the perforated region 32 can comprise through-holes 33 no larger than 2 mm across their largest dimension and comprise open space in the range of 25 to 65 percent. Other size ranges and open space ranges may be utilized and still provide effective radiation absorption.

The perforated region may extend substantially across the entire shield. Alternatively, the perforated region 32 may be restricted to a smaller portion of the shield. Also alternatively, the perforated region may comprise a plurality of distinct sub-regions distributed across the shield. The perforated region 32 may be interrupted by various other holes and penetrations having different dimensions from the through-holes 33 of the perforated region 32.

In some embodiments, the perforated region 32 may extend around the periphery of the shield 31. For example, the perforated region 32 can comprise a band of perforations around the periphery of the shield 31. In an embodiment, the perforated region 32 comprises a 10-40 mm wide band of perforations around the periphery of the shield 31, with the outermost holes of the region 32 spaced inwards from the shield 31 outermost boundary 34 by at least 1 mm.

The shield 31 may be spaced apart from the pad 21 and provide increased air flow via an outflow-air passage 71 between the shield 31 and the pad top surface 24. The outflow-air passage can comprise a plurality of passages. The outflow-air passage 71 can be provided by offsetting the shield 31 from the top surface 24. Alternatively, the outflow-air passage can be provided by forming pathways through the top surface 24. Various other means and methods for providing the outflow-air passage may be employed.

In another embodiment, where the pad comprises a hollow shell, the shield can be attached directly to the shell. In similar embodiments, the shell can include additional air vents through the bottom surface so that air can pass into the shell from the shield on top and exit the shell through the vents on the bottom, and vice versa.

The lap cushion 10 can further comprise a medial layer 61 positioned between the shield 31 and the top surface 24. The medial layer 61 can provide structural support to the shield 31 and to the lap cushion 10. Additionally, the medial layer 61 may act as additional insulating barrier between the laptop and the user, and may be designed to provide a certain thermal conductivity coefficient. In some embodiments, the medial layer 61 comprises a thermal conductivity coefficient (also known as a K-factor) that is significantly lower than the corresponding K-factor of the pad, to ensure that heat emanating from the laptop is absorbed by the medial layer 61 rather than be transferred to the user. The medial layer can comprise thermally conductive material that acts in concert with the shield 31 and with the pad to disperse heat from the laptop across the top surface 24. In other embodiments, the opposite may be true, and the difference may be dependent on the configuration of the shield/pad/layer in the specific embodiment. The medial layer may comprise plastic, rubber, and combinations and composites of materials. The medial layer 61 may be substantially rigid to provide stiffness and structural integrity, and may be flexible to enhance comfort and ruggedness. The medial layer 61 may connect the shield 31 to the pad, for example, by adhesive connection to the shield 31 and to the pad where contact between the shield 31 and the layer 61 is substantial to facilitate heat transfer between the shield 31 and the layer 61, and between the layer 61 and the pad. Alternatively, the shield 31 may be connected to the layer 61 at discrete points and spaced apart from the layer 61 otherwise to facilitate airflow between the shield 31 and the layer 61. Similarly, the layer can be mounted to the pad in various ways and configurations. The pad, layer, and shield arrangement can be modified in different embodiments so as to provide different configurations tailored to varying materials, shapes, and intended application. The medial layer can be designed to provide a specific porosity so as to enhance airflow around the shield 31 and the pad.

Some embodiments of the lap cushion may include additional cushioning, for example, on the bottom surface, the top surface, at various corners and other external surfaces.

The lap cushion 10 can comprise one or more electric fans 41 to facilitate cooling the surfaces of the electronic device proximal the cushion 10. The fan 41 can facilitate cooling the laptop and dissipating heat absorbed by the pad 21 and by the shield 31. In one embodiment, the pad 21 has two fans 41 mounted to the pad 21 beneath the shield 31, though one fan could also be used in a similar fashion. In the embodiment, each fan 41 is shown mounted in a fan cavity 22 in the pad 21, and each fan 41 propels air towards the shield 31. Some embodiments may have a fan propelling air away from the shield, for example, into the pad, and drawing intake air from proximal the shield.

Figure 2:
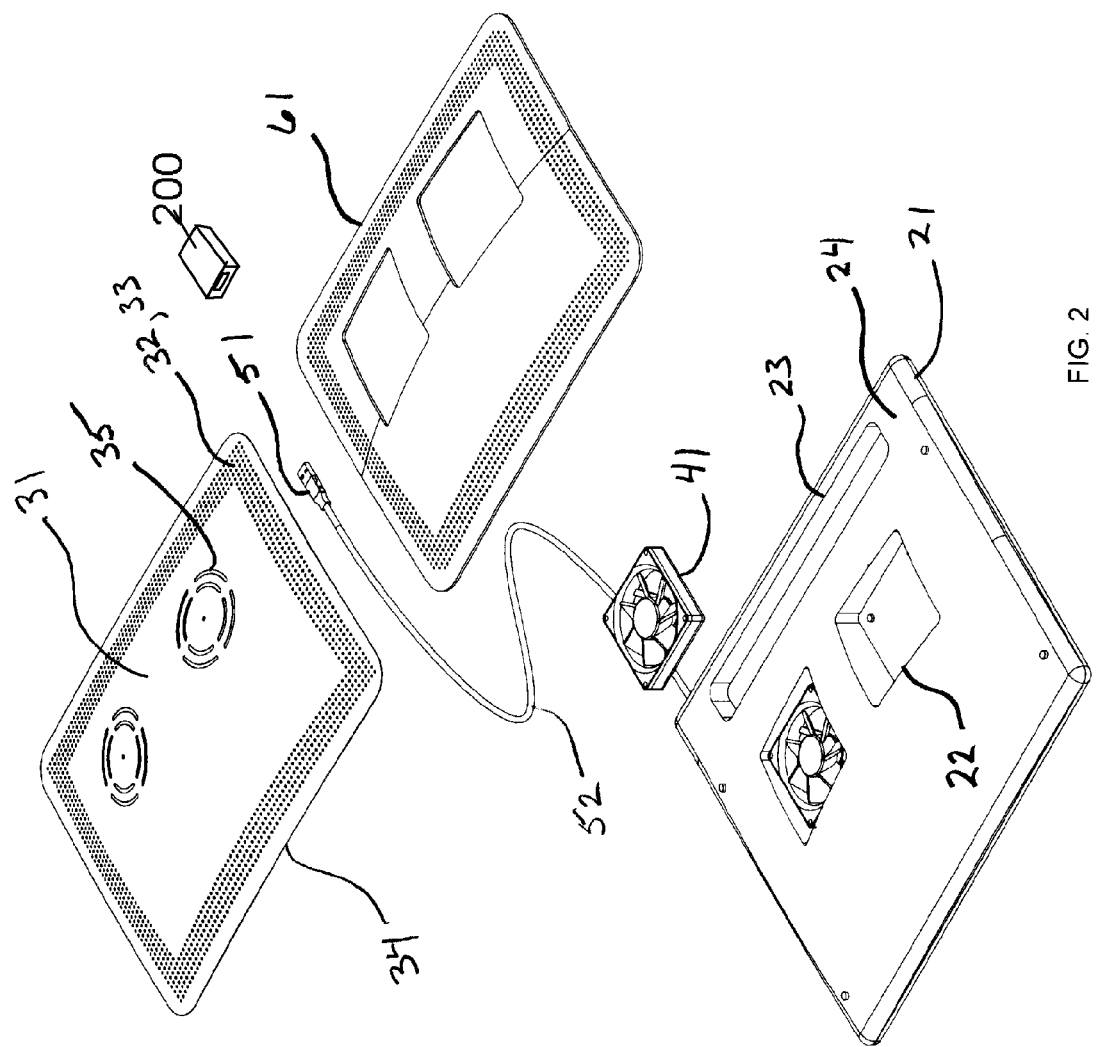
FIG. 2 is an exploded perspective view of an embodiment of the invention.

The fan 41 can direct air at the shield 31, and the air can travel across the shield 31 via an outflow-air passage 71 between the pad 21 and the shield 31. In such a way, the fan-propelled air can absorb heat from the shield 31 and expel heat into the atmosphere away from the laptop and the lap cushion 10. When the shield 31 comprises a perforated region 32, fan-propelled air can additionally pass through the shield 31 via the perforated region 32 and impinge upon the laptop surface 24, absorbing heat directly from the laptop. The fan-propelled air can similarly expel heat away from the laptop and the lap cushion 10. The shield 31 may include one or more fan cut-outs 35 to facilitate airflow through the shield 31. The one or more fans 41 may be reversible to propel air in either direction. The fan 41 may optionally be powered by a battery 200 as shown in FIG. 2.

In an embodiment comprising a medial layer 61, the layer 61 can be connected between the pad 21 and the shield 31 in various ways as previously described, where some of the ways may include an outflow-air passage. Persons having ordinary skill in the art (PHOSITA) will recognize configurations of pad, layer, and shield, having perforations, fan cut-outs, and outflow-air passages, such that the configurations are within the general principles disclosed herein and adhere to the broad aspects of the illustrated embodiments, variations and combinations thereof.

The pad 21 material can further facilitate cooling the shield 31 and dispelling heat from the laptop away from the lap cushion. For example, pad 21 material having high porosity and open surface architecture can provide pathways for air to flow though the pad itself. It is understood that heat transfer can be promoted by a combination of large surface area exposed to moving air. Some pad materials can provide such a combination and so promote the dissipation of heat from high temperature areas to lower temperature areas.

For example, a pad comprising 3-dimensional, knitted, spacer fabric can have porosity between 60 and 96 percent. Such high porosity provides significant air passages through the material as well as correspondingly high surface area exposed within the air passages. The spacer fabric helps to cool the shield in at least two ways. One, in an embodiment without a fan, the spacer fabric can enable air flow through the pad via convection, so that cooler air proximal, for example, the pad bottom surface 25, can rise through the pad to replace warm air proximal the shield and the laptop. Two, in an embodiment having a fan 41 directed at the shield, the fan 41 can draw intake air through the pad for cooling the shield and the laptop. A fan directed away from the shield can simply reverse the direction of the above-mentioned case, and draw intake air (now warm air) from proximal the shield and laptop, and propel the warm air through the pad. In each case the high porosity spacer fabric offers low resistance to air flow through the pad, and the high exposed surface area within the spacer fabric can encourage heat transfer from the air to the pad.

This detailed description refers to specific examples in the drawings and illustrations. These examples are described in sufficient detail to enable those skilled in the art to practice the inventive subject matter. These examples also serve to illustrate how the inventive subject matter can be applied to various purposes or embodiments. Other embodiments are included within the inventive subject matter, as mechanical, electrical, and other changes can be made to the exemplary embodiments. Features of various embodiments described herein, however essential to the example embodiments in which they are incorporated, do not limit the inventive subject matter as a whole, and any reference to the invention, its elements, operation, and application are not limiting as a whole, but serve only to define these example embodiments. This detailed description does not, therefore, limit embodiments, which are defined only by the appended claims. Each of the embodiments described herein are contemplated as falling within the inventive subject matter, which is set forth in the following claims.

We claim:

1. A lap cushion for supporting an electronic device having wireless communication capabilities, the cushion comprising:

a resilient pad comprising a bottom surface and a top surface;

an electrically conductive shield extending across the majority of the top surface;

at least one electric fan mounted to the pad and propelling air through the shield and away from the pad.

2. The lap cushion of claim 1, wherein the shield comprises at least one fan cut-out pattern positioned to pass fan-propelled air through the shield and away from the pad.

3. The lap cushion of claim 1, wherein the shield is spaced apart from the top surface to provide an outflow-air passage between the shield and the top surface to pass air between the shield and the top surface.

4. The lap cushion of claim 1 wherein the fan draws intake air substantially through the resilient pad and exhausts fan-propelled air through the shield.

5. The lap cushion of claim 1 wherein the fan draws intake air substantially through the resilient pad.

6. The lap cushion of claim 1 wherein the fan is powered by the electronic device via a USB connector connected to the electronic device.

7. The lap cushion of claim 1 wherein the fan is powered by a battery.

8. A lap cushion having targeted RF shielding protecting a user from RF electromagnetic radiation emanating from an electronic device with wireless communication capabilities, the cushion comprising:

a resilient pad comprising a bottom surface and a top surface, the bottom surface being configured to rest on a lap, and the pad having a pad thermal conductivity coefficient;

an electrically-conductive shield extending across a majority of the top surface;

the shield comprising a perforated region extending at least around a shield periphery, the perforated region having a plurality of through-holes distributed across the perforated region to produce an open area between 25 and 65 percent, each through-hole being less than 10 mm across the largest dimension;

a medial layer separating the shield and the cushion, the layer having a layer thermal conductivity coefficient, and the layer thermal conductivity coefficient being lower than the pad thermal conductivity coefficient; and at least one electric fan mounted within a pad cavity beneath the shield, the at least one fan propelling air through the shield away from the pad.

9. The lap cushion of claim 8 wherein the perforated region extends across the majority of the shield.

10. The lap cushion of claim 8 wherein the shield is grounded to the electronic device via a USB connector connected to the electronic device.

11. The lap cushion of claim 8 wherein the fan is powered by the electronic device via a USB connector connected to the electronic device.

12. A lap cushion for supporting an electronic device, the cushion comprising:

a resilient pad comprising a bottom surface and a top surface;

an electrically conductive shield extending across at least a portion of either the top or bottom surface;

an electric fan propelling air through the shield and away from the pad.

13. The lap cushion of claim 12, wherein the fan draws intake air substantially through the resilient pad and exhausts air through the shield.

14. The lap cushion of claim 12 wherein the shield is grounded to the electronic device via a USB connector connected to the electronic device.

15. The lap cushion of claim 12 wherein the electric fan is powered by the electronic device via a USB connector connected to the electronic device.

16. The lap cushion of claim 12 wherein the fan is powered by a battery.

* * * * *